United States Patent [19]

Takechi et al.

[11] Patent Number: 5,403,699
[45] Date of Patent: Apr. 4, 1995

[54] PROCESS FOR FORMATION OF RESIST PATTERNS

[75] Inventors: Satoshi Takechi, Tokyo; Yuko Nakamura, Kawasaki; Akiko Kotachi, Yokohama, all of Japan

[73] Assignee: Fujitsu Limited, Kawasaki, Japan

[21] Appl. No.: 100,343

[22] Filed: Aug. 2, 1993

Related U.S. Application Data

[63] Continuation of Ser. No. 956,558, Oct. 5, 1992, abandoned, which is a continuation of Ser. No. 599,880, Oct. 19, 1990, abandoned.

[30] Foreign Application Priority Data

Oct. 19, 1989 [JP] Japan ................................ 1-272514
Dec. 13, 1989 [JP] Japan ................................ 1-323024

[51] Int. Cl.$^6$ .......................... G03F 7/32; G03F 7/039
[52] U.S. Cl. ................................ 430/296; 430/270; 430/311; 430/331; 430/942
[58] Field of Search ............... 430/270, 296, 311, 331, 430/942

[56] References Cited

FOREIGN PATENT DOCUMENTS 0064222 4/1982 European Pat. Off. .
0230656 12/1986 European Pat. Off. .
0385447 2/1990 European Pat. Off. .
59-99720 6/1984 Japan ................................ 430/331
63-137227 6/1988 Japan .
63-273856 11/1988 Japan ................................ 430/331

*Primary Examiner*—Kathleen Duda
*Attorney, Agent, or Firm*—Staas & Halsey

[57] ABSTRACT

A pattern formation process using a positive-working resist material of the formula (I):

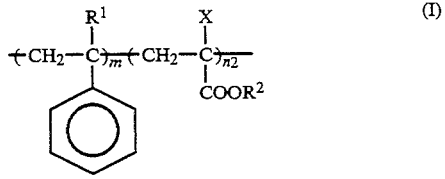

in which $R^1$ and $R^2$ may be the same or different, and each represents a substituted or unsubstituted lower alkyl group, X represents a halogen atom, and m and n each is larger than 0 and smaller than 100; and carrying out the development of the selectively exposed resist material with xylene for 10 to 20 minutes, or with other solvent(s). This process effectively obtains fine resist patterns having an increased sensitivity and excellent resolution without a reduction of the layer thickness in an unexposed area of the resist and resist residues in an exposed area of the same.

7 Claims, 2 Drawing Sheets

×640

DEVELOPED FOR 5 MIN.

×640

DEVELOPED FOR 20 MIN.

×640
DEVELOPED FOR 5 MIN.

×640
DEVELOPED FOR 20 MIN.

PROCESS FOR FORMATION OF RESIST PATTERNS

This application is a continuation of application Ser. No. 07/956,558, filed Oct. 5, 1992, which is a continuation of application Ser. No. 07/599,880, filed Oct. 19, 1990, both now abandoned.

BACKGROUND OF THE INVENTION

1. Field of the Invention

The present invention relates to a process for the formation of resist patterns using a specific positive-working resist material and a specific developer suitable for the resist material. According to the pattern formation process of the present invention, fine resist patterns having an increased sensitivity and excellent resolution can be obtained, while avoiding a reduction of the layer thickness in an unexposed area of the resist coating and the formation of resist residues in an exposed area thereof. Therefore, the present process can be advantageously utilized in the production of semiconductor devices such as semiconductor integrated circuits, for example, Large Scale Integrated Circuits (LSIs) or Very Large Scale Integrated Circuits (VLSIs).

2. Description of the Related Art

Recently, the degree of integration of the semiconductor integrated circuits has been remarkably increased, and, for example, LSIs and VLSIs are now widely used as essential elements in a variety of electronic devices. LSIs and VLSIs, as is well-known in the art, can be produced, because it is now possible to obtain fine patterns of conductive circuit lines and electrodes. For example, it is possible to obtain fine patterns having a minimum width of less than 1 $\mu$m, i.e., on a submicron order.

As an exposure source for the formation of fine resist patterns, ultraviolet (UV) rays was widely utilized, because of many advantages thereof, but since these rays have a relatively long wavelength, the resist patterns obtained using the UV rays as the exposure source were limited to those having a minimum pattern or line width of about 1.5 $\mu$m.

To further reduce the possible minimum pattern width of the resulting resist patterns, it was found that ionizing radiations, such as electron beam (EB) or X-rays, could be used instead of UV rays as the exposure source. For example, the EB is sufficient to obtain fine resist patterns on the submicron order because it has a remarkably short wavelength of generally around 0.1 Å.

The resist process based on the EB exposure can be classified into two types, depending upon the surface configuration of the underlying material to be coated with the resist patterns. One resist process is used to apply resist patterns onto a flat surface of the underlying material, and another resist process is used to apply resist patterns onto an uneven or stepped surface of the underlying material. The former process is particularly suitable for the production of reticles and masking means, and the latter process is particularly suitable for the production of multilayered circuits. Note, the resist process of the present invention, as described hereinafter in detail, concerns the former process.

The inventors of this application recently discovered a novel positive-working electron beam resist. The EB resist, as disclosed in Japanese Unexamined Patent Publication (Kokai) No. 63-137227, published on Jun. 9, 1988, is characterized by consisting of a copolymer of e-methylstyrene and α-chloroacrylic ester of the formula:

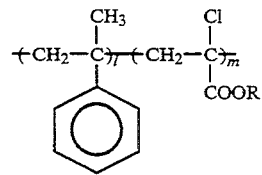

in which
R represents an alkyl group such as methyl or haloalkyl group, and
l and m each are not equal to zero.

Surprisingly, the described EB resist showed a good adhesion to the underlying material, such as a silicon substrate and a good sensitivity, in addition to an excellent resolution and resistance to dry etching, when a coating thereof was selectively exposed to the electron beam and then developed with xylene, for example, for 3 to 5 minutes. A longer development time was avoided, because it causes a reduction of the layer thickness in an unexposed area of the resist coating while increasing an EB sensitivity of the resist. Note, An object of the invention of Japanese Kokai 63-137227 is to provide a novel EB resist having a higher sensitivity than that of poly(methyl methacrylate) (PMMA) and a higher resistance to dry etching than that of poly(butene sulfone) (PBS), and therefore it does not disclose the extension of the development time which causes additional drawbacks. Also note, in the EB resist of Japanese Kokai 63-137227, the excellent resistance thereof to dry etching relies upon the presence of a benzene ring of α-methyl-styrene, and the high sensitivity thereof relies upon the presence of α-chloro group in α-chloroacrylic ester.

As described above, the EB resist of Japanese Kokai 63-137227 shows a high sensitivity, but there is a need to more increase the sensitivity of the EB resist, to widen the scope of use thereof. Increasing the amount of EB irradiated on the resist causes an accumulation of the heat in the resist on a quartz applying to a reticle and thus induces a deformation of the resulting resist patterns and other defects. These defects were notably observed in the production of fine resist patterns on the submicron order during the EB lithographic process.

SUMMARY OF THE INVENTION

One object of the present invention is to provide an improved process for the formation of resist patterns, which process is especially suitable for the EB resist described in the above-described Japanese Kokai 63-137227, and similar EB resists.

Another object of the present invention is to provide an improved process for the formation of resist patterns, which process ensures a greatly increased sensitivity without a thermal deformation of the resulting fine resist patterns.

Still another object of the present invention is to provide an improved process for the formation of resist patterns, which process ensures a highly increased sensitivity and excellent resistance to dry etching in the absence of a reduction of the layer thickness in an unexposed area of the resist.

Still another object of the present invention is to provide an improved process which also enables a complete removal of resist residues in an exposed area of the resist coating, in addition to the above-described prevention of the reduction of layer thickness. This is because, in the formation of highly dense resist patterns, resist residues are liable to be produced in an exposed area of the resist coating.

Other objects of the present invention will be understood from the following description of the present invention with reference to preferred embodiments thereof.

Namely, the inventors found that the above-described objects can be accomplished by using a positive-working resist material which consists of a copolymer of α-alkylstyrene and α-haloacrylic ester of the formula (I):

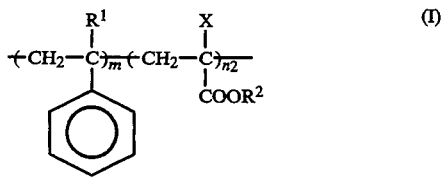

in which

R$^1$ and R$^2$ may be the same or different, and each represents a substituted or unsubstituted lower alkyl group, X represents a halogen atom, and m and n each is larger than 0 and smaller than 100, and by developing the selectively exposed coating of the resist material under specific development conditions.

In one aspect of the present invention, there is provided a process for the formation of resist patterns, which comprises the steps of:

applying a positive-working resist material to a substrate; the resist consisting of a copolymer of α-alkylstyrene and α-haloacrylic ester of the above-described formula (I);

exposing the resulting coating of the resist material to a pattern of radiations; and developing the pattern-wise exposed resist with a developer which essentially consists of xylene for 10 to 20 minutes to remove the resist in an exposed area thereof.

In another aspect of the present invention, there is provided a process for the formation of resist patterns, which comprises the steps of:

applying a positive-working resist material to a substrate; the resist consisting of a copolymer of α-alkylstyrene and α-haloacrylic ester of the above-described formula (I);

exposing the resulting coating of the resist material to a pattern of radiations; and developing the pattern-wise exposed resist with a developer which essentially consists of at least one solvent selected from the group consisting of aromatic hydrocarbon solvents exclusive of xylene, and ketone solvents, to remove the resist in an exposed area thereof.

Also, in another aspect of the present invention, there is provided a process for the formation of resist patterns which, in addition to the above-described steps of formation of resist patterns, selective or pattern-wise exposure and development, further comprises the step of rinsing after the development with a rinsing solution which consists of at least one solvent capable of dissolving off a resist residue in the exposed area of the resist, but incapable of substantially dissolving the remaining resist in an unexposed area of the resist.

DESCRIPTION OF THE PREFERRED EMBODIMENTS

Figure 1:
FIG. 1 is an electron micrograph (x 640) of the prior art resist patterns obtained after development with a mixture of MIBK/IPA for 5 minutes.

In the practice of the present invention, a copolymer of α-alkyl-styrene and α-haloacrylic ester of the formula (I):

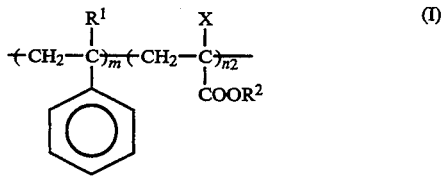

in which

R$^1$ and R$^2$ may be the same or different, and each represents a substituted or unsubstituted lower alkyl group such as methyl or ethyl, X represents a halogen atom such as chlorine, and m and n each is larger than 0 and smaller than 100 is used as the resist material. Preferably, the copolymer of the formula (II)

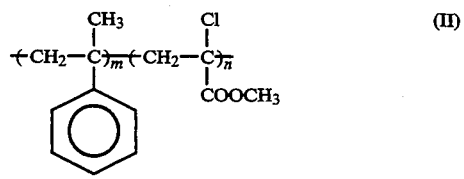

in which m and n are as defined above, is used as the resist material. These copolymers as the resist material may be prepared in accordance with conventional polymerization processes.

The above-described resist material is applied to a substrate such as silicon or quartz. The resist material is preferably coated from a solution thereof onto the substrate. Any conventional coating techniques such as spin coating, dip coating or brush coating may be used herein. Note, if desired, other underlying materials including layers or coatings may be used in place of the semiconductor substrate.

After application of the resist material onto the substrate, the resulting resist coating is exposed to a pattern of zadiations, to conduct a selective exposure of the same. Any conventional ionizing radiations may be used as the exposure source, and suitable examples of the radiations include electron beam, X-rays and deep UV rays. Commercially available exposure apparatuses may be used to conduct this selective or pattern-wise exposure.

The pattern-wise exposed resist is then developed in accordance with the manner of the present invention to selectively remove an exposed area. According to the present invention, the development of the resist is carried out in accordance with two different methods, depending on the specific developer used.

First, the pattern-wise exposed resist is developed with a developer which essentially consists of xylene, for 10 to 20 minutes. Unexpectedly, the inventors found that the development time of 10 to 20 minutes is long enough to prevent a reduction of the layer thickness in an unexposed area while retaining a highly increased sensitivity. Note, if desired, the developer may contain a small amount of solvent(s) other than xylene, if they have no adverse affect on the desired results.

Second, the exposed resist coating is developed with a developer which essentially consists of at least one solvent selected from the group consisting of aromatic hydrocarbon solvents exclusive of xylene, and ketone solvents. The term "ketone solvents" used herein is intended to mean any solvents containing at least one carbonyl (CO) group in a molecule thereof. Suitable aromatic hydrocarbon solvents include, for example, toluene, ethylbenzene or a mixture thereof with xylene, and suitable ketone solvents include, for example, methyl ethyl ketone, methyl isobutyl ketone, cyclohexanone or a mixture thereof. Using these developers, the development of the exposed resist is preferably carried out for about 10 seconds to about 15 minutes. Examples of suitable developers, and a preferred range of the development time for each developer, are summarized in the following Table 1.

TABLE 1

| developer | development time |
| --- | --- |
| ethylbenzene | 3 to 15 min. |
| toluene | 1 to 3 min. |
| toluene/xylene (1:1) | 1 to 5 min. |
| cyclohexanone | 5 to 10 min. |
| methyl ethyl ketone (MEK) | 10 to 15 sec. |

After the development is completed, a desired fine pattern of the resist material is obtained on the substrate.

A pattern formation process of the present invention is generally stopped after a series of processings described above, but to remove the resist residues in the exposed area, it is preferable to rinse the developed resist coating with a rinsing solvent which consists of at least one solvent capable of dissolving off a resist residue in the exposed area, but incapable of substantially dissolving an unexposed area. Examples of solvents suitably used as the rinsing solvent include carbon tetrachloride, xylene, methyl isobutyl ketone, isopropyl alcohol or a mixture thereof. Of course, other solvents may be used as the rinsing solvent, if desired.

As is apparent from the above description, the present invention is directed to the selection of a suitable developer and to the choosing of a suitable development time, to thereby increase a sensitivity of the resist and obtain other effects of the present invention. Namely, the process of the present invention is an improvement of the resist process disclosed in the above-cited Japanese Kokai 63-137227.

To attain the above-described objects of the present invention, the inventors made an intensive study of a wide variety of developers, including xylene, under different developing conditions, and many types of resist materials including those of the formula (I), (II) and (III) were tested. These studies were made as follows:

As previously mentioned, when a composition of the resist material used is not changed, a sensitivity of the resist can be increased if the developing time is extended, but for a positive-working resist material, the resolution thereof is undesirably reduced with an increase of the developing time. This is because the resist material in an unexposed area of the resist is dissolved off with the developer, and thus a layer thickness of the unexposed area is reduced. For the production of reticles and masking means (briefly masks), it is generally desired to limit a reduction of the layer thickness in the unexposed area of the resist coating to at most 1000 Å, assuming that the resist coating has a thickness as thin as about 5000 Å.

Keeping the above requirement in mind, the inventors tried to find optimum developing conditions for the different developers.

The resist materials used herein are the following three copolymers of α-methylstyrene and α-chloroacrylic methyl ester (1:1):

Copolymer I (Resist I):
weight-average molecular weight ($\overline{Mw}$) ... 31,000
degree of dispersion ... 1.9
Copolymer II (Resist II):
weight-average molecular weight ($\overline{Mw}$) ... 56,000
degree of dispersion ... 2.0
Copolymer III (Resist III):
weight-average molecular weight ($\overline{Mw}$) ... 71,000
degree of dispersion ... 1.9

Each resist material (Resist I, II or III) was dissolved in o-dichlorobenzene to prepare a resist solution. The resist solution was then spun-coated at a thickness of 5000 Å on a silicon substrate, and baked at 180° C. for 20 minutes in an oven. The resulting resist coating was selectively exposed to an electron beam at an accelerated voltage of 20 kV on an electron beam exposure apparatus "ERE 301" commercially available from Erionics Co., and then developed with a developer described in the following Table 2, 3 or 4. The resulting resist patterns were evaluated to determine the suitable developing time at which the maximum sensitivity is obtained with regard to each developer. The results are summarized in the following Tables 2, 3 and 4. Note, the results of Resist I, those of Resist II, and those of Resist III are also summarized in the Tables 2, 3 and 4, respectively.

TABLE 2

| developer | developing time | sensitivity ($\mu C/cm^2$) | results |
| --- | --- | --- | --- |
| xylene | 20 min. | 11.2 | good |
| ethylbenzene | 7 min. | 12.8 | good |
| toluene | 1 min. | 11.2 | good |
| toluene/xylene (1:1) | 3 min. | 11.2 | good |
| cyclohexanone | 5 min. | 16.0 | good |
| methyl ethyl ketone (MEK) | 10 sec. | 11.2 | good |
| 1,4-dioxane | 1 min. | 12.8 | bad |
| pentoxone | 5 min. | 22.4 | bad |
| n-propyl acetate | 5 min. | 12.8 | bad |

The 1,4-dioxane as the developer showed an unacceptably Large reduction of the layer thickness in the unexposed area; pentoxone showed a bad sensitivity; and, n-propyl acetate produced the residues of the resist in the exposed area after development.

TABLE 3

| developer | developing time | sensitivity ($\mu C/cm^2$) | results |
|---|---|---|---|
| toluene | 5 min. | 8.8 | good |
| MEK | 45 sec. | 7.9 | good |
| MEK/MIBK (2:1) | 2 min. | 7.8 | good |
| MEK/MIBK (3:2) | 2 min. | 9.9 | good |
| 1,4-dioxane | 1 min. | 11.2 | bad |

MIBK . . . abbreviation of methyl isobutyl ketone

MIBK . . . . abbreviation of methyl isobutyl ketone

The results indicated that the use of 1,4-dioxane should be avoided, because it produces cracks in the resist. Similar cracks were also observed in the resist developed with 1,4-dioxane, as shown in Table 4.

TABLE 4

| developer | developing time | sensitivity ($\mu C/cm^2$) | results |
|---|---|---|---|
| toluene | 5 min. | 9.4 | good |
| MEK | 45 sec. | 7.2 | good |
| MEK/MIBK (2:1) | 2 min. | 7.7 | good |
| MEK/MIBK (3:2) | 2 min. | 9.9 | good |
| 1,4-dioxane | 1 min. | 10.6 | bad |

The results shown in Tables 2 to 4 indicate that the best sensitivity was obtained with the aromatic hydrocarbon solvents such as toluene, ethylbenzene and xylene, and the ketone-series solvents such as cyclohexanone and methyl ethyl ketone. Also, it was noted that, with xylene as the developer, a reduction of the layer thickness in the unexposed area was diminished to a negligible level, even though the developing time was extended to 20 minutes. This means that xylene is a developer ensuring a high sensitivity.

Figure 2:
FIG. 2 is an electron micrograph (x 640) of the prior art resist patterns obtained after development with a mixture of MIBK/IPA for 20 minutes.
Figure 3:
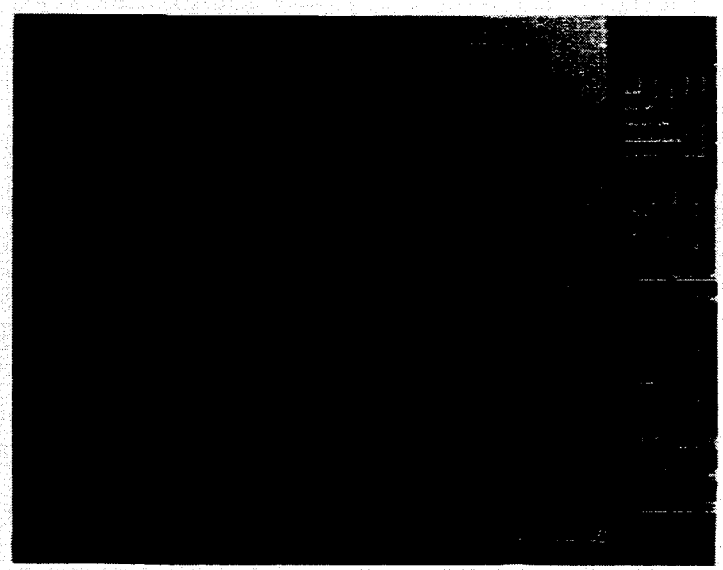
FIG. 3 is an electron micrograph (x 640) of the resist patterns of the present invention obtained after development with xylene for 5 minutes.
Figure 4:
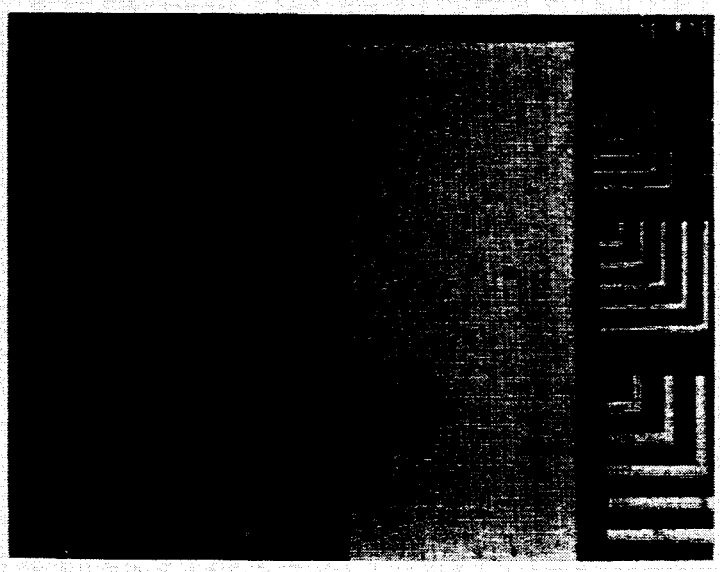
FIG. 4 is an electron micrograph (x 640) of the resist patterns of the present invention obtained after development with xylene for 20 minutes.

For reference, four electron micrographs (each x640) of the resist patterns obtained in accordance with the prior art process and the process of the present invention are attached hereto, in which:

FIG. 1 is an electron micrograph (x640) of the prior art resist patterns obtained after development with a mixture of MIBK/IPA for 5 minutes;

FIG. 2 is an electron micrograph (x640) of the prior art resist patterns obtained after development with a mixture of MIBK/IPA for 20 minutes;

FIG. 3 is an electron micrograph (x640) of the resist patterns of the present invention obtained after development with xylene for 5 minutes; and, FIG. 4 is an electron micrograph (x640) of the resist patterns of the present invention obtained after development with xylene for 20 minutes. The observed reduction in the layer thickness in the unexposed area is summarized in the following Table 5.

TABLE 5

| Resist patterns of FIG. No. | Reduction of layer thickness |
|---|---|
| FIG. 1 | 375Å |
| FIG. 2 | 2220Å |
| FIG. 3 | 50Å or less |
| FIG. 4 | 120Å |

Note, the prior art process (corres. to FIGS. 1 and 2) was carried out by using the positive-working acrylic resist "EBR-9" commercially available from Toray Limited.

The developing conditions applied to the pattern formation process of the present invention are considered to be very strong, because when the developer used is rapidly evaporated off by, for example, blowing nitrogen ($N_2$) gas or spinning off, the resist material or copolymer dissolved in the developer remains as a residue in the exposed area. To remove the remaining development residue, i.e., resist residue, from the exposed area, it is necessary to rinse the developed resist with a suitable rinsing solvent, and then dry. As the rinsing solvent, generally, a solvent or a mixture thereof incapable of dissolving the copolymer used as the resist material is used; such rinsing solvents, however, have a tendency to produce the resist residue, as a result of a remarkable reduction of solubility for the copolymer.

Conversely, as previously described, the inventors found that a solution which consists of at least one solvent capable of dissolving off a resist residue in the exposed area, but incapable of substantially dissolving the unexposed area is suitable as the rinsing solvent. Namely, the solvents useful as the rinsing solvent are considered to be classified into a group between "good solvents" for the resist used and "bad solvents" for the resist used. The most satisfactory results are obtained when carbon tetrachroride, xylene, methyl isobutyl ketone (MIBK) or a mixture of MIBK and isopropyl alcohol (IPA) is used as the rinsing solvent.

The present invention will be further described with reference to working examples thereof, which do not restrict the scope of the present invention.

EXAMPLE 1

A chromium (Cr) layer having a thickness of 1000 Å was vacuum-deposited on a quartz substrate, a copolymer of α-methylstyrene and methyl α-chloroacrylate ester (1:1; $\overline{Mw}=31,000$; degree of dispersion $=1.9$) was then spun-coated from o-dichlorobenzene onto the chromium-deposited quartz substrate, and the resulting resist coating having a thickness of 5000 Å was pre-baked at 180° C. for 20 minutes.

Therefore, the resist coating was exposed to a predetermined pattern of an electron beam, at an accelerated voltage of 20 kV and an exposure level of 12.0 $\mu C/cm^2$ on an EB exposure apparatus "ERE 301" commercially available from Erionics Co., and the exposed resist was then developed with xylene as a developer, for 20 minutes. Satisfactory fine resist patterns having a resolution of 2 $\mu m$ line & space were obtained.

To evaluate a resistance of the resulting resist patterns to dry etching, the quartz substrate having the resist patterns on a surface thereof was placed in a reactive ion etching (RIE) apparatus, and using a mixture of $CCl_4$ and $O_2$ (1:1) as an etching gas and the resist patterns as a masking means, the underlying chromium layer was dry-etched for 6 minutes at a pressure of 0.2 Torr and 13.56 MHzRF power of 500 W. The resist patterns were exactly transferred to the underlying chromium layer, and this result indicates that the resist patterns have an excellent resistance to dry etching.

EXAMPLE 2

The procedure of the Example 1 was repeated, except that the exposure dosage was reduced to 11.5 $\mu C/cm^2$, and the development was made with toluene (in place of xylene) for one minutes. Similar satisfactory fine resist patterns having a resolution of 2 $\mu m$ line & space were obtained.

Next, the reactive ion etching was carried out as in Example 1, and the resist patterns were exactly transferred to the underlying chromium layer.

EXAMPLE 3

The procedure of Example 1 was repeated, except that the exposure dosage was increased to 16.0 μC/cm², and the development was made with cyclohexanone (in place of xylene) for 5 minutes. Similarly, satisfactory fine resist patterns having a resolution power of 2 μm line & space were obtained.

Next, the reactive ion etching was carried out as in the Example 1, and the resist patterns were exactly transferred to the underlying chromium layer.

EXAMPLE 4

A copolymer of α-methylstyrene and methyl α-chloroacrylate (1:1; Mw =56,000; degree of dispersion=2.0) was spin-coated from o-dichlorobenzene on the reticle substrate, and the resulting resist having a thickness of 5000 Å was then prebaked at 200° C. for 20 minutes on a hot plate.

Thereafter, the resist was exposed to a predetermined pattern of an electron beam at an accelerated voltage of 20 kV on an EB exposure apparatus "ERE 301" commercially available from Erionics Co., and the exposed resist was then spray-developed with ethylbenzene as a developer for 10 minutes.

After the spray development, the patterned resist was rinsed with a solvent described in Table 6 as a rinsing solution, for 60 seconds, and after the rinsing, the resist patterns were each quantitatively evaluated to ascertain whether or not a resist residue was formed. The results are summarized in Table 6.

TABLE 6

| rinsing solution | resist residue |
| --- | --- |
| xylene | No |
| carbon tetrachloride | No |
| MIBK | No |
| MIBK/IPA (9:1) | No |
| MIBK/IPA (5:5) | No |
| acetone | Yes |
| isooctane | Yes |
| cyclohexane/ethylbenzene (1:1) | Yes |
| IPA | Yes |
| No (control) | Yes |

The above procedures were repeated, except that the rinsing time was shortened to 30 seconds, and similar results were obtained.

The above results indicate that xylene, carbon tetrachloride, MIBK, and a mixture of MIBK and IPA are all excellent as a rinsing solvent in the practice of the present invention.

We claim:

1. A process for the formation of resist patterns, which comprises the steps of:

(a) applying a positive-working resist material to a substrate; the resist consisting of a copolymer of α-alkylstyrene and α-haloacrylic ester of the formula (I):

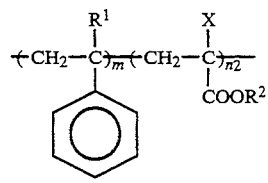

in which
R¹ and R² may be the same or different, and each represents a substituted or unsubstituted alkyl group having less than three carbon atoms,
X represents a halogen atom, and
m and n each is larger than 0 and smaller than 100;

(b) exposing the resulting coating of the resist material to a pattern of radiation; and (c) developing the pattern-wise exposed resist with a developer which essentially consists of at least one solvent selected from the group consisting of aromatic hydrocarbon solvents, exclusive of xylene, and the group consisting of methyl ethyl ketone cyclohexanone, a mixture of methyl ethyl ketone and methyl isobutyl ketone and a mixture of cyclohexanone and methyl isobutyl ketone, to remove the resist in an exposed area thereof.

2. A process according to claim 1, in which the copolymer as the resist material is represented by the formula (II):

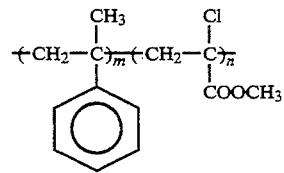

3. A process according to claim 2, in which an electron beam is used in step (b) for the pattern of radiation.

4. A process according to claim 1, in which the aromatic hydrocarbon solvents consist of toluene, ethylbenzene or a mixture thereof.

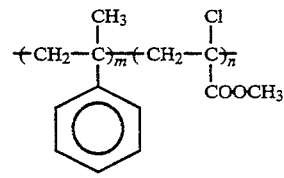

5. A process according to claims 1, in which the exposed resist is developed with the selected developer for 10 seconds to 15 minutes.

6. A process according to claim 1, which further comprises the step of rinsing the developed resist with a rinsing solvent which consists of at least one solvent capable of dissolving off a resist residue in the exposed area of the resist, but incapable of substantially dissolving the remaining resist in an unexposed area of the resist.

7. A process according to claim 6, in which the solvent used as the rinsing solvent is carbon tetrachloride, xylene, methyl isobutyl ketone or a mixture thereof.

* * * * *

UNITED STATES PATENT AND TRADEMARK OFFICE
CERTIFICATE OF CORRECTION

PATENT NO. : 5,403,699
DATED : April 4, 1995
INVENTOR(S) : Satoshi TAKECHI et al.

It is certified that error appears in the above-indentified patent and that said Letters Patent is hereby corrected as shown below:

<u>Col. 2</u>, line 2, change "e-methylstyrene" to --α-methylstyrene--.

<u>Col. 4</u>, line 64, change "zadiations" to --radiations--.

<u>Col. 8</u>, line 3, start a new paragraph after "area.".

Signed and Sealed this

Thirteenth Day of June, 1995

Attest:

BRUCE LEHMAN

Attesting Officer

Commissioner of Patents and Trademarks